United States Patent
Huang

[19]

[11] Patent Number: 6,018,541
[45] Date of Patent: Jan. 25, 2000

[54] DFB LASER WAVEGUIDE HAVING PERIODIC DISTRIBUTION OF GAINS AND ABSORPTIONS OF ENERGY

[75] Inventor: Yidong Huang, Tokyo, Japan

[73] Assignee: NEC Corporation, Tokyo, Japan

[21] Appl. No.: 08/900,283

[22] Filed: Jul. 25, 1997

[30] Foreign Application Priority Data

Jul. 26, 1996 [JP] Japan ................................. 8-197279

[51] Int. Cl.[7] .................................................. H01S 3/085
[52] U.S. Cl. .............................. 372/50; 372/96; 372/102
[58] Field of Search ............................... 372/96, 102, 50

[56] References Cited

U.S. PATENT DOCUMENTS 4,847,856  7/1989  Sugimura et al. ........................ 372/50

FOREIGN PATENT DOCUMENTS 417384  1/1992  Japan.

Primary Examiner—James W. Davie
Attorney, Agent, or Firm—Sughrue, Mion, Zinn Macpeak & Seas, PLLC

[57] ABSTRACT

The waveguide of a distributed feedback laser is divided into first and second regions along a dividing line normal to the length of the waveguide. A phase shift is introduced to an interface between these regions so that the first region defines a gain-coupled diffraction grating structure when a first electric field is applied to it and the second region defines a loss-coupled diffraction grating structure when a second electric field opposite to the first electric field is applied. The former structure has a distribution of energy gains at periodic intervals and the latter structure has a distribution of energy absorptions at the same periodic intervals. One of the energy absorptions adjacent the dividing line is contiguous with one of the energy gains adjacent the dividing line. The energy gains and the energy absorptions occur at intervals equal to one-half wavelength of the output laser beam and the phase shift between the two regions is equal to a quarter wavelength of the laser beam.

10 Claims, 4 Drawing Sheets

DFB LASER WAVEGUIDE HAVING PERIODIC DISTRIBUTION OF GAINS AND ABSORPTIONS OF ENERGY

BACKGROUND OF THE INVENTION

1. Field of the Invention

The present invention relates generally lasers, and more specifically to a distributed feedback laser suitable for reducing noise caused by reflecting light.

2. Description of the Related Art

Semiconductor lasers have been extensively employed as light sources of optical fiber links, and connectors have been used for coupling the lasers with the fiber links. Some of the output energy of a semiconductor laser is often reflected off the connector or other optical components and returns to the laser. The returning light enters the laser and causes noise inside the laser. Such noise can lead to an error in transmitted symbols. Optical isolators have been developed to overcome this problem. However, they are not suitable for applications where cost savings is of primary importance.

Japanese Laid-Open Patent Specification Hei 4-17384 discloses a distributed feedback laser where the active layer is divided into a current injection region and non-injection region adjacent the end face of the laser through which the laser output is emanated. The diffraction grating structure of the non-injection (non-excited) region is used as a distributed reflector to prevent reflecting light from entering the laser through the output end face. However, the non-excited region has the same reflectivity to the output beam as well as to returning light rays. As a result, it is difficult to reduce the effect caused by the returning light rays. Additionally, because of the high loss of the non-excited region, difficulty is encountered in implementing low threshold lasers.

SUMMARY OF THE INVENTION

It is therefore an object of the present invention to provide a distributed feedback laser which can effectively avoid the effect of returning light and is simple for implementation.

According to a first aspect of the present invention, there is provided a distributed feedback laser comprising an optical waveguide divided into first and second regions along a dividing line normal to the length of the waveguide. A phase shift is introduced to an interface between the first and second regions so that the first region defines a gain-coupled diffraction grating structure when a first electric field is applied thereto and the second region defines a loss-coupled diffraction grating structure when a second electric field opposite to the first electric field is applied thereto. The gain-coupled diffraction grating structure has a distribution of energy gains at periodic intervals and the loss-coupled diffraction gracing structure having a distribution of energy absorptions at the periodic intervals, one of the energy absorptions which is adjacent the dividing line being contiguous with one of the energy gains which is adjacent the dividing line. First and second electrodes are provided for respectively producing the first and second electric fields in the first and second regions. Preferably, the energy gains and the energy absorptions occur at intervals equal to a half wavelength of a laser beam and the phase shift at the interface between the first and second regions is equal to a quarter wavelength of the laser beam.

According to a second aspect, the present invention provides a distributed feedback laser comprising an optical waveguide divided into first, second and third regions along first and second dividing lines normal to the length of the waveguide. A first phase shift is introduced to an interface between the first and second regions so that the first region defines a gain-coupled diffraction gracing structure when a first electric field is applied thereto and the second region defines a first loss-coupled diffraction grating structure with no electric field being applied thereto. A second phase shift is introduced to an interface between the second and third regions so that the third region defines a second loss-coupled diffraction grating structure when a second electric field opposite to the first electric field is applied thereto. The gain-coupled diffraction grating structure has a distribution of energy gains at periodic intervals and each of the first and second loss-coupled diffraction gracing structures has a distribution of energy absorptions at the periodic intervals. One of the energy absorptions of the second region which is adjacent the first dividing line is contiguous with one of the energy gains which is adjacent the first dividing line, one of the energy absorptions of the third region which is adjacent the second dividing line being contiguous with one of the energy absorptions of the second region which is adjacent the second dividing line. First and second electrodes are provided for producing the first and second electric fields in the first and third regions, respectively. Preferably, the energy gains of the first region and the energy absorptions of the second and third regions occur at intervals equal to a half wavelength of a laser beam, and the first phase shift at the interface between the first and second regions and the second phase shift at the interface between the second and third regions are equal to a quarter wavelength of the laser beam.

BRIEF DESCRIPTION OF THE DRAWINGS

The present invention will be described in further detail with reference to the accompanying drawings, in which.

DETAILED DESCRIPTION

Figure 1:
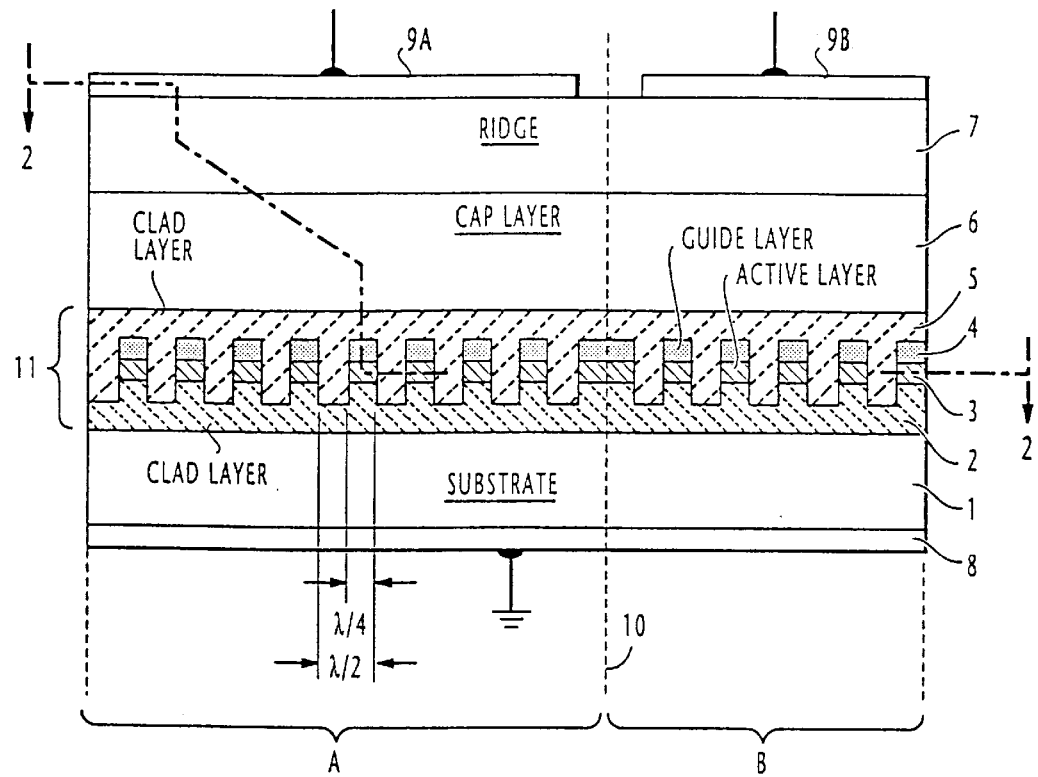
FIG. 1 is a view, in elevation, of a distributed feedback laser according to a first embodiment of the present invention.
Figure 2:
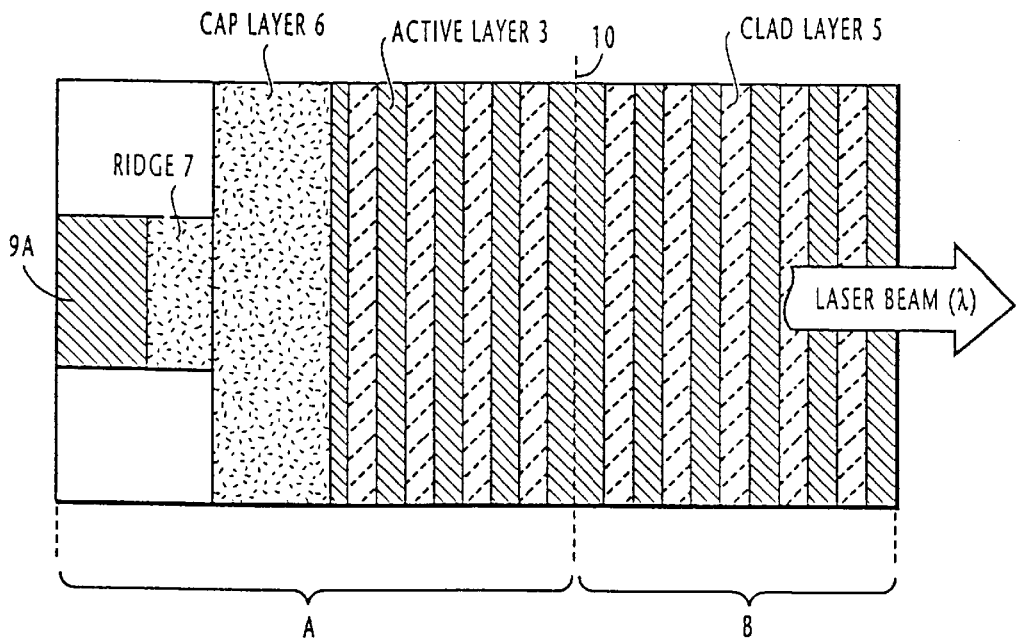
FIG. 2 is a cross-sectional view taken along the lines 2 of FIG. 1.

In FIGS. 1 and 2, there is shown a distributed feedback (DFB) laser according to the present invention. The DFB laser comprises an InP substrate 1, a GaInAsP lower clad layer 2, an active layer 3, a guide layer 4, an upper clad layer 5 of different refractive index than chat of the lower clad layer 2. On the upper clad layer 5 is a cap layer 6. Along the length of the laser, the cap layer 6 has a ridge portion 7 of width, typically 2 microns.

An optical waveguide 11 is formed by the active layer 3, the guide layer 4, and the dielectric clad layers 2 and 5. A dividing line 10 is drawn in a direction normal to the length of waveguide 11. The waveguide 11 is divided along this line into a region A of gain-coupled diffraction grating structure and a region B of loss-coupled diffraction grating structure.

A grounded electrode 8 is attached to the substrate 1 and electrodes 9A and 9B are attached to the ridge 7 in locations corresponding respectively to the regions A and B. With respect to the ground electrode 8, electrodes 9A and 9B are biased at positive and negative potentials, respectively.

Along the waveguide 11, the active layer 3 and guide layer 4 are corrugated between the two layers 2 and 5 into a series of parallel crests and troughs at intervals equal to one half of the laser wavelength ($\lambda$) so that the dimension of each crest and each trough of the waveguide along its length is equal to a quarter of the laser wavelength.

Figure 3:
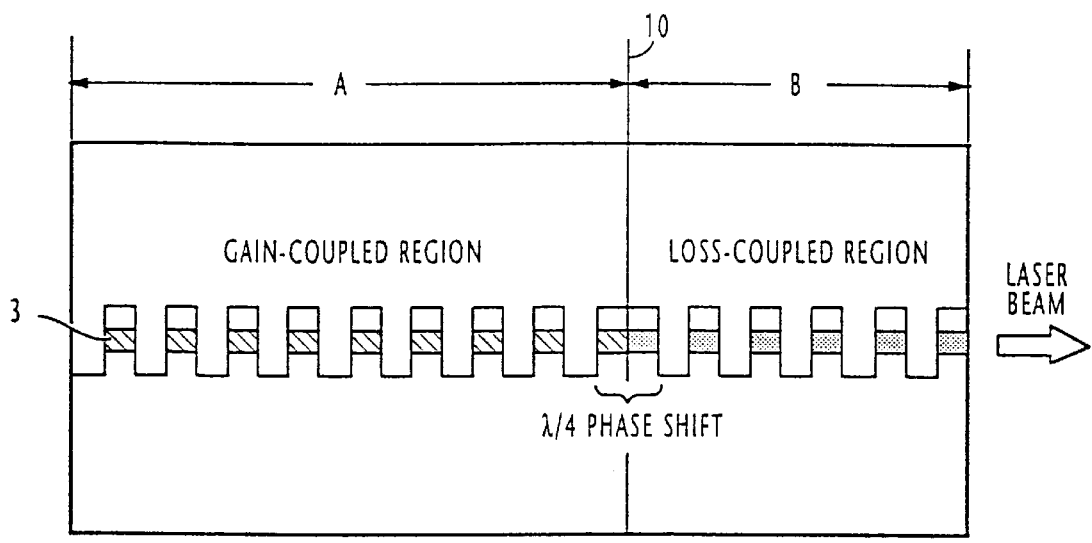
FIG. 3 is a diagram illustrating a waveguide divided between a gain-coupled region and a loss-coupled region according to the FIG. 1 embodiment.

As clearly shown in FIG. 3, a quarter-wavelength phase-shift is introduced to the waveguide 11 between regions A and B by repeating the first crest (i.e., energy absorption) of region B contiguously with the last crest (i.e., energy gain) of region A.

Figure 4:
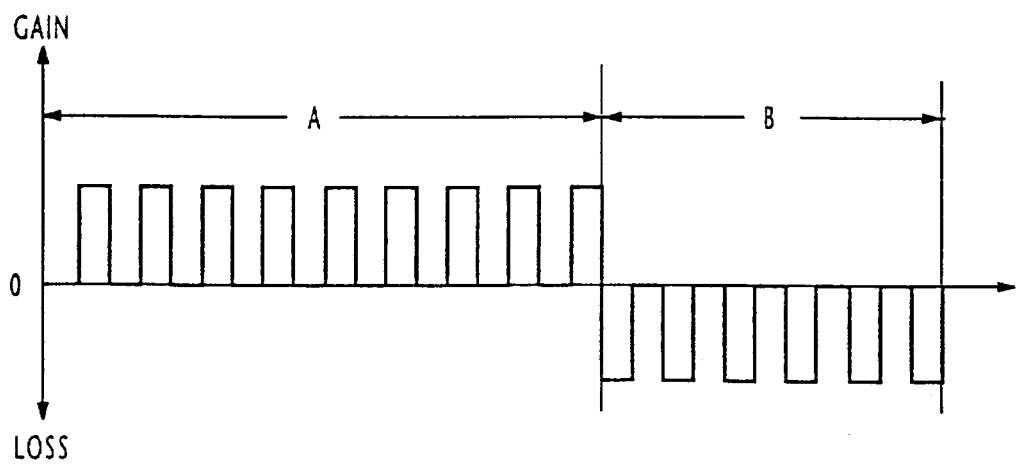
FIG. 4 is a diagram illustrating the periodic gain and loss patterns of the waveguide of FIG. 3.

By the application of a positive potential to electrode 9A, the waveguide of region A functions as a gain-coupled diffraction grating structure by producing optical energy at periodic intervals, whereas the application of a negative potential to electrode 9B causes the waveguide of region B to function as a loss-coupled diffraction grating structure by absorbing optical energy at periodic intervals. FIG. 4 illustrates the optical gain of region A and the optical loss of region B.

Figure 5:
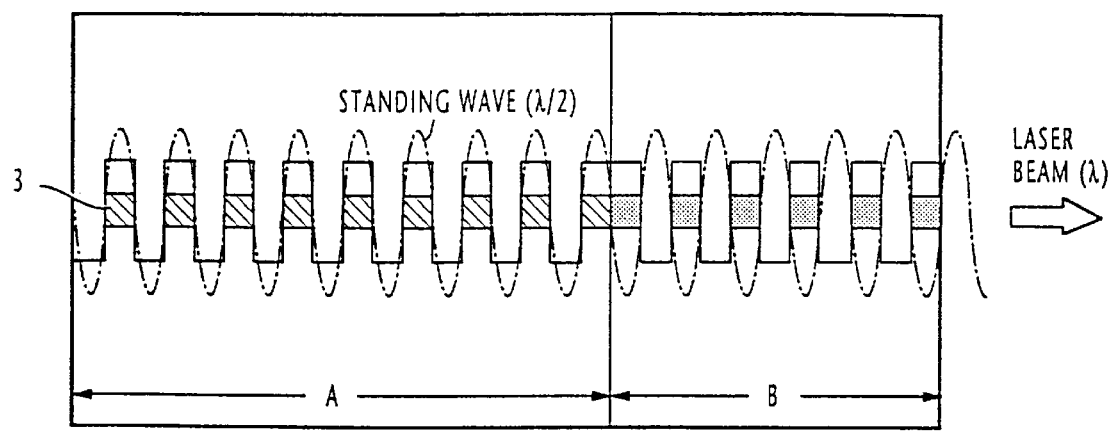
FIG. 5 is a view useful for explaining the wave pattern of a standing wave with respect to the crests of the gain-coupled region of the waveguide and the troughs of the loss-coupled region.

As shown in FIG. 5, a standing wave at wavelength equal to one half of the laser wavelength $\lambda$ is generated in the region A by current injected into the active layer 3 of region A by the application of the positive potential to electrode 9A. By the application of the negative potential to electrode 9B, energy absorption occurs at the crests of the waveguide in region B, but no energy absorption occurs at the troughs of the waveguide in region B.

More specifically, the crests of the standing wave within region A coincide with the crests of the waveguide of region A and hence, the optical energy of the standing wave is amplified by the current injected into region and an injected laser action occurs. By virtue of the gain-coupled laser action of the waveguide in region A, the crests and troughs of the standing wave are fixed in position throughout the waveguide 11. Because of the $\lambda/4$ phase shift, the crests of the standing wave within region B coincide with the troughs of the waveguide of region B, where no energy absorption occurs. therefore, the standing wave is not affected by the loss-coupled diffraction grating structure of region B.

Figure 6:
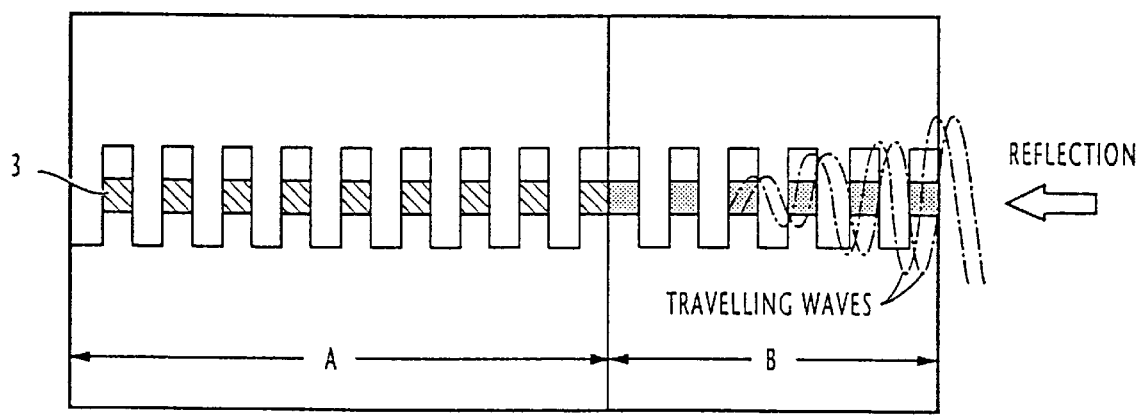
FIG. 6 is a view useful for explaining the effect of the loss-coupled region of the waveguide on returning traveling waves entering the laser through its output end.

On the other hand, if laser beams are reflected back and entered into the DFB laser through its output end as shown in FIG. 6, their crests and troughs pass through the waveguide of region B because of their traveling nature and their energy is effectively absorbed by the active layer 3 of region B.

The polarities of the potentials applied to the electrodes 9A and 9B can be reversed if it is desired that the output laser beam is emanated from the other end face of the laser.

Figure 7:
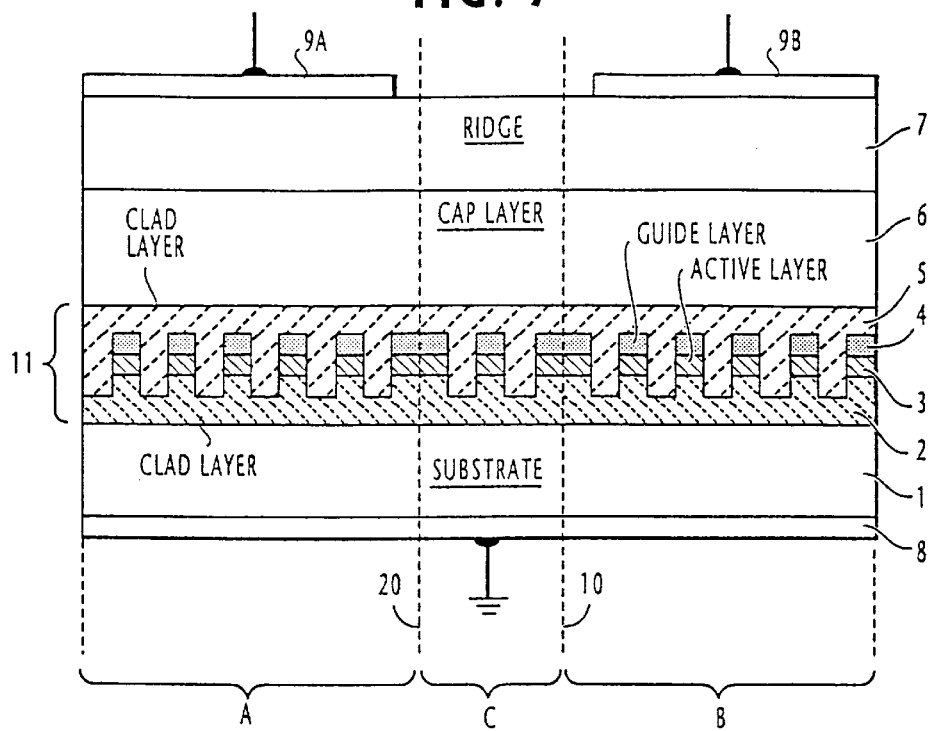
FIG. 7 is a view, in elevation, of a distributed feedback laser according to a second embodiment of the present invention.

A modified embodiment of this invention is illustrated in FIG. 7. In this modification, the waveguide 11 has an additional quarter-wavelength ($\lambda/4$) phase shift along a line 20, thus producing an intermediate region C between end regions A and B as illustrated. Electrodes 9A and 9B are provided for injecting currents in opposite directions only into the active layer 3 of the end regions A and B in the same manner as in the previous embodiment. No electrode is provided for the intermediate region C. Therefore, an additional loss-coupled diffraction grating waveguide structure is defined within the intermediate region C.

Figure 8A:
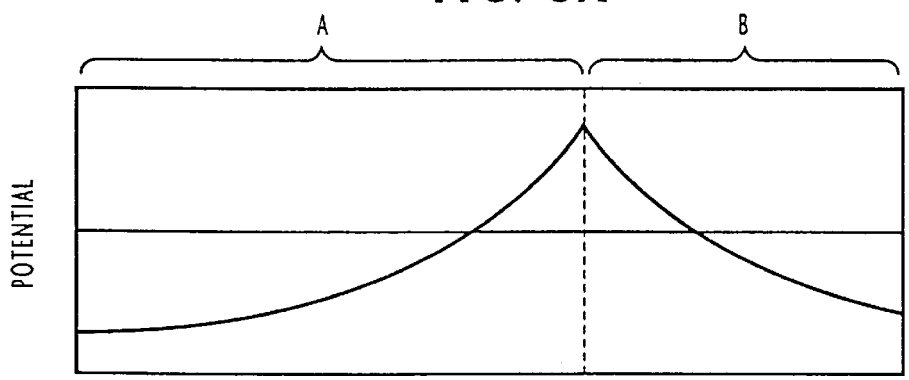
FIGS. 8A and 8B are potential distribution diagrams of the first and second embodiments of the present invention, respectively.
Figure 8B:
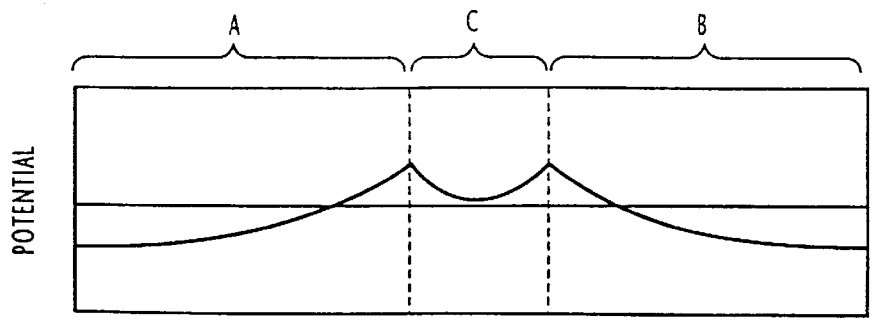

As indicated by a potential distribution in FIG. 8A, the single phase-shift waveguide structure of the previous embodiment has a potential peak at the interface between regions A and B. This potential peak is high and tends to produce spatial hole burning. The provision of the additional loss-coupled intermediate waveguide region has the effect of reducing the peak potential difference. The waveguide of the modified embodiment has two potential peaks respectively located at the interfaces between regions A and C and regions C and B. As illustrated in FIG. 8B, the FIG. 7 embodiment has lower peak potential differences than the single peak potential difference of FIG. 1 embodiment.

What is claimed is:

1. A distributed feedback laser comprising:

an optical waveguide divided into first and second waveguide sections along a dividing line normal to the length of the optical waveguide, there being a phase shift at an interface between said first and second waveguide sections so that said first waveguide section defines a gain-coupled diffraction grating structure when a first electric field is applied thereto and said second waveguide section defines a loss-coupled diffraction grating structure when a second electric field opposite to the first electric field is applied thereto, said gain-coupled diffraction grating structure having a distribution of energy gains at periodic intervals and said loss-coupled diffraction grating structure having a distribution of energy absorptions at said periodic intervals, one of said energy absorptions which is adjacent said dividing line being contiguous with one of said energy gains which is adjacent said dividing line;

a first electrode for producing said first electric field in said first waveguide section; and a second electrode for producing said second electric field in said second waveguide section.

2. A distributed feedback laser as claimed in claim 1, wherein said energy gains and said energy absorptions occur at intervals equal to a half wavelength of a laser beam and wherein said phase shift at the interface between said first and second waveguide sections is equal to a quarter wavelength of said laser beam.

3. A distributed feedback laser as claimed in claim 1, wherein the first and second waveguide sections comprise;

a first layer formed with a plurality of clad regions successively arranged along the length of the optical waveguide;

a second layer formed with a plurality of clad regions alternately arranged with the clad regions of the first layer along the length of the optical waveguide;

a third layer of active regions which are disposed between the first and second layers and respectively aligned with the clad regions of one of the first and second layers; and wherein portions of said first and second waveguide sections which are adjacent said dividing line are contiguous with each other to form said phase shift.

4. A distributed feedback laser as claimed in claim 1, wherein the first and second waveguide sections comprise:

a first layer formed with a plurality of clad regions successively arranged along the length of the optical waveguide;

a second layer formed with a plurality of clad regions alternately arranged with the clad regions of the first layer along the length of the optical waveguide;

a third layer of active regions respectively aligned with the clad regions of one of the first and second layers;

a fourth layer of guide regions respectively aligned with said active regions;

wherein said third and fourth layers are disposed between said first and second layers; and wherein portions of said first and second waveguide sections which are adjacent said dividing line are contiguous with each other to form said phase shift.

5. A distributed feedback laser as claimed in claim 2, wherein said intervals at which said energy gains and said energy absorptions occur are formed at twice a wavelength of said phase shift.

6. A distributed feedback laser comprising:

an optical waveguide divided into first, second and third waveguide sections along first and second dividing lines normal to the length of the optical waveguide, there being a first phase shift at an interface between said first and second waveguide sections so that said first waveguide section defines a gain-coupled diffraction grating structure when a first electric field is applied thereto and said second waveguide section defines a first loss-coupled diffraction grating structure with no electric field being applied thereto, and there being a second phase shift at an interface between said second and third waveguide sections so that said third waveguide section defines a second loss-coupled diffraction grating structure when a second electric field opposite to the first electric field is applied thereto, said gain-coupled diffraction grating structure having a distribution of energy gains at periodic intervals and each of said first and second loss-coupled diffraction grating structures having a distribution of energy absorptions at said periodic intervals, one of the energy absorptions of the second waveguide section which is adjacent said first dividing line being contiguous with one of said energy gains which is adjacent said first dividing line, and one of the energy absorptions of the third waveguide section which is adjacent said second dividing line being contiguous with one of the energy absorptions of the second waveguide section which is adjacent said second dividing line;

a first electrode for producing said first electric field in said first waveguide section; and a second electrode for producing said second electric field in said third waveguide section.

7. A distributed feedback laser as claimed in claim 6, wherein said energy gains of the first waveguide section and said energy absorptions of the second and third waveguide sections occur at intervals equal to a half wavelength of a laser beam, and wherein the first phase shift at the interface between said first and second waveguide sections and the second phase shift at the interface between said second and third waveguide sections are equal to a quarter wavelength of said laser beam.

8. A distributed feedback laser as claimed in claim 6, wherein the first, second and third waveguide sections comprise:

a first layer formed with a plurality of clad regions successively arranged along the length of the optical waveguide;

a second layer formed with a plurality of clad regions alternately arranged with the clad regions of the first layer along the length of the optical waveguide;

a third layer of active regions which are disposed between the first and second layers and respectively aligned with the clad regions of one of the first and second layers;

wherein portions of said first and second waveguide sections which are adjacent said first dividing line are contiguous with each other to form said first phase shift; and wherein portions of said second and third waveguide sections which are adjacent said second dividing line are contiguous with each other to form said second phase shift.

9. A distributed feedback laser as claimed in claim 6, wherein the first, second and third waveguide sections comprise:

a first layer formed with a plurality of clad regions successively arranged along the length of the optical waveguide;

a second layer formed with a plurality of clad regions alternately arranged with the clad regions of the first layer along the length of the optical waveguide;

a third layer of active regions respectively aligned with the clad regions of one of the first and second layers;

a fourth layer of guide regions respectively aligned with said active regions;

wherein said third and fourth layers are disposed between said first and second layers;

wherein portions of said first and second waveguide sections which are adjacent said first dividing line are contiguous with each other to form said first phase shift; and wherein portions of said second and third waveguide sections which are adjacent said second dividing line are contiguous with each other to form said second phase shift.

10. A distributed feedback laser as claimed in claim 7, wherein said intervals at which said energy gains and said energy absorptions occur are formed at twice a wavelength of said first and second phase shifts.

* * * * *